(12) United States Patent
Kim et al.

(10) Patent No.: US 8,709,832 B2
(45) Date of Patent: Apr. 29, 2014

(54) CHIP ON FILM (COF) PACKAGE HAVING TEST LINE FOR TESTING ELECTRICAL FUNCTION OF CHIP AND METHOD FOR MANUFACTURING SAME

(75) Inventors: Hyoung-ho Kim, Kyungki-do (KR); Ye-jung Jung, Kyungki-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 165 days.

(21) Appl. No.: 13/212,527

(22) Filed: Aug. 18, 2011

(65) Prior Publication Data
US 2012/0061669 A1 Mar. 15, 2012

Related U.S. Application Data

(63) Continuation-in-part of application No. 12/254,255, filed on Oct. 20, 2008, now abandoned, which is a continuation of application No. 10/061,099, filed on Feb. 1, 2002, now Pat. No. 7,442,968.

(30) Foreign Application Priority Data

Mar. 30, 2001 (KR) .................. 10-2001-0016871

(51) Int. Cl.
*H01L 21/00* (2006.01)
(52) U.S. Cl.
USPC .................................. 438/15; 438/14; 438/17
(58) Field of Classification Search
USPC ................................................ 438/14–15, 17
See application file for complete search history.

(56) References Cited

U.S. PATENT DOCUMENTS 5,888,837 A * 3/1999 Fillion et al. .................... 438/15

* cited by examiner

*Primary Examiner* — Laura Menz
(74) *Attorney, Agent, or Firm* — F. Chau & Associates, LLC

(57) ABSTRACT

A chip on film (COF) package and a method for manufacturing same are provided. The COF package comprises a base film, a semiconductor chip mounted on the base film, a signal-inputting portion mounted on the base film, a first passive element mounted on the base film and comprising first and second terminals and a first signal line formed on the base film and connecting the first passive element to the semiconductor chip, wherein the first signal line comprises a connection pad connected to the first terminal of the first passive element and a first test line connected to the signal-inputting portion.

8 Claims, 6 Drawing Sheets

CHIP ON FILM (COF) PACKAGE HAVING TEST LINE FOR TESTING ELECTRICAL FUNCTION OF CHIP AND METHOD FOR MANUFACTURING SAME

CROSS-REFERENCE TO RELATED APPLICATION

This application is a Continuation-In-Part of U.S. application Ser. No. 12/254,255 filed on Oct. 20, 2008, which is a Continuation of U.S. application Ser. No. 10/061,099 filed on Feb. 1, 2002, now U.S. Pat. No. 7,442,968 issued on Oct. 28, 2008 that claims priority to Korean Patent Application No. 10-2001-0016871, filed on Mar. 30, 2001, in the Korean Intellectual Property Office, the disclosures of which are incorporated by reference herein in their entireties.

BACKGROUND

1. Field of the Invention

The present invention relates to a semiconductor device, and more particularly, to a chip on film (COF) package comprising test lines for testing the electrical function of the internally formed chip terminals and a method for manufacturing the COF package.

2. Description of Related Art

As electronic devices employing a liquid crystal device (LCD) become thinner and smaller, integrated circuit (IC) packages for LCDs are required to have a larger amount of input/output terminals to perform various functions, while at the same time becoming thinner. A tape carrier package (TCP) technique for manufacturing an integrated circuit (IC) having a tape-shaped package has been developed to meet such requirements.

TCP comprises a tape automated bonding (TAB) package and a chip on film (COF) package. TAB package technique comprises coating an adhesive on a tape (which is used for a base film), and adhering a copper (Cu) foil to the tape by using the adhesive. The adhered Cu foil is then wired according to a designed pattern, and a lead wired on the tape is connected to a chip. Because TAB packages are thinner and have improved flexibility, they are typically used in various electronic devices such as laptop computers (notebook computers), mobile phones, watches, and measuring instruments and apparatuses.

A COF package technique provides an improvement over the TAB package technique. For instance, since the thickness of a polyimide tape of COF package is 25 µm, the COF package has more flexibility than the TAB package having the polyimide tape of 75 µm. Further, since passive elements such as resistors and capacitors can be mounted on the COF package, the size of an external printed circuit board (PCB) can be reduced. That is, the COF packages mount the passive elements thereon, thereby improving noise properties and minimizing the number of terminals of a connector for connecting to the external PCB.

However, a conventional COF package has a disadvantage in that the number of terminals to be tested is limited. For instance, several terminals of a semiconductor chip device are integrated into one terminal through capacitors and resistors and are connected to an external PCB. On the other hand, the electrical function testing of the COF package is performed by using the terminals of the connector connected to the external PCB. Thus, many terminals internally formed in a COF package cannot be tested for electrical function. As a result, it is difficult for a conventional COF package to test electrical function on each pad of a chip.

SUMMARY OF THE INVENTION

It is an object of the present invention to provide a chip on film (COF) package comprising test lines capable of easily testing the electrical function of the internally formed chip terminals.

It is another object of the present invention to provide a method for manufacturing a chip on film (COF) package.

According to one aspect of the present invention, there is provided a chip on film (COF) package comprising a base film, a semiconductor chip mounted on the base film, a signal-inputting portion mounted on the base film, a first passive element mounted on the base film and comprising first and second terminals and a first signal line formed on the base film and connecting the first passive element to the semiconductor chip, wherein the first signal line comprises a connection pad connected to the first terminal of the first passive element and a first test line connected to the signal-inputting portion.

According to another aspect of the present invention, there is provided a method for manufacturing a chip on film (COF) package. The method comprises forming a plurality of signal lines comprising a first signal line comprising a connection pad and a test line on a base film and mounting a first passive element comprising first and second terminals, a semiconductor chip and a signal-inputting portion on the base film, wherein the mounting of the semiconductor chip, the signal-inputting portion, and the first passive element comprises mounting the first terminal of the first passive element to be connected to the connection pad, and mounting the semiconductor chip to be connected to the first signal line, and mounting the signal-inputting portion to be connected to the test line.

BRIEF DESCRIPTION OF THE DRAWINGS

The foregoing and other objects, aspects and advantages will become better understood from the following detailed description of preferred embodiments of the invention with reference to the drawings, in which.

DETAILED DESCRIPTION OF PREFERRED EMBODIMENTS

Figure 1:
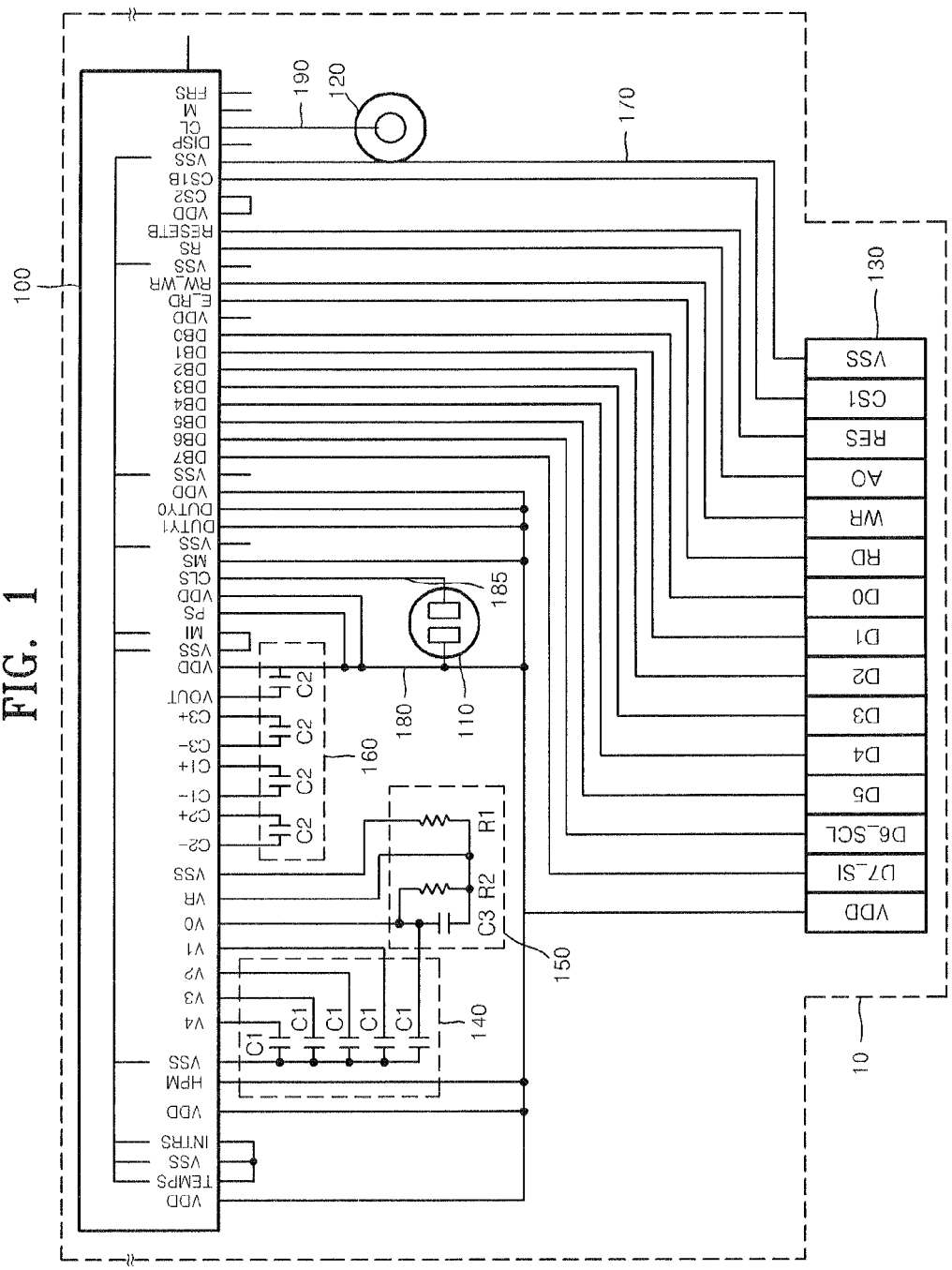
FIG. 1 illustrates a chip on film (COF) package according to a preferred embodiment of the present invention.

FIG. 1 illustrates a chip on film (COF) package according to a preferred embodiment of the present invention. For example, FIG. 1 shows a COF package used for a liquid crystal device (LCD) driver chip.

Referring to FIG. 1, a COF package 10 comprises a LCD driver chip 100, patterned signal lines 170, test pads 110 and 120 for testing electrical functions of the chip 100, passive elements 140, 150, and 160, and a signal-input portion 130. The COF package adheres a copper (Cu) foil to a tape and is wired according to a design pattern without coating an adhesive on a polyimide base film.

The signal-input portion 130 comprises terminals for communicating with an external printed circuit board (PCB), and, through the terminals, receives a plurality of data and control signals from an external control circuit (for example, a microprocessor). The signal-input portion 130 transmits data and control signals to the LCD driver chip 100 through the signal lines 170.

For instance, the signal-input portion 130 comprises input/output terminals D0 through D7 for inputting or outputting predetermined data, for example, 8-bit data, from a microprocessor (not shown), RD and WR terminals for receiving a read enable signal and a write enable signal, respectively, an AO terminal for selecting whether the input/output terminals D1 through D7 input data (that is displayed on a LCD) or control signals, a RES terminal for inputting a RESET signal, and a CS1 terminal for selecting a chip. Further, the signal-input portion 130 comprises a supply voltage VDD and a ground voltage VSS. The data and the control signals are enabled only if the CS1 is enabled.

The signal lines 170 connect the signal-input portion 130 to each terminal of the LCD driver chip 100.

The LCD driver chip 100 receives predetermined data and control signals from a microprocessor (not shown) through the signal-input portion 130 and the signal lines 170. The LCD driver chip 100 generates driving signals for driving a LCD panel (not shown) and outputs the driving signals to the LCD panel such that a screen is displayed on an external LCD panel. An output terminal of the LCD panel is not shown in FIG. 1 for simplicity.

The LCD driver chip 100 comprises a TEMPS terminal for controlling a rate of variation in voltage according to variation in temperature, an INTRS terminal for deciding the gain of an internal operational amplifier (not shown) of the LCD driver chip 100 and for determining whether an internal resistor is used for controlling the gain, a power control terminal HPM for a power supply circuit of the LCD driver and for representing a normal node or a high power mode in accordance with a level state such as high or low, and LCD driving voltage terminals V0 through V4 each having a different voltage level from each other. For example, if the chip 100 comprises a voltage generating circuit, the different voltages of the terminals V1 through V4 can either be internally generated from a high voltage V0 or can be provided from an external source. Each of the terminals V0 through V4 is connected to the passive element 140 external to the chip 100.

The LCD driver chip 100 further comprises a VR terminal for controlling voltage V0 and for controlling the voltage of the terminal V0 by using the passive element 150 when the chip 100 does not comprises resistors for voltage control. Further, terminals C2+, C2−, C1+, C1−, C3+, and C3− are for connecting capacitors for an internal voltage booster (that are capacitors of the passive element 160). The chip 100 further comprises a MI terminal for deciding the type of a microprocessor, a PS terminal for deciding a data interface mode and for selecting parallel or serial data input, and a CLS terminal for enabling/disabling the inputting of test clock signal. For instance, when the CLS terminal is set to a high level to enable the CLS terminal, an internal clock signal is output through a CL terminal. When the CLS terminal is set to a low level to disable the CLS terminal, an external clock signal is input through the C1 terminal. The LCD driver chip 100 further comprises a MS terminal for selecting a master mode or a slave mode, and DUTY0 and DUTY1 terminals for deciding the duty rates of the LCD driver.

Furthermore, the LCD driver chip 100 comprises DB0 through DB7 terminals for inputting 8-bit parallel data from, or outputting 8-bit parallel data to, an external microprocessor connected to the terminals D0 through D7 of the signal-input portion 130, a E_RD terminal for inputting a read enable clock signal, a RW_WR terminal for read/write control, and a RS terminal for inputting a register select signal. For example, the RE_WR terminal may be used as a read/write control input terminal or a write enable clock-input terminal according to the type of the microprocessor. For instance, the DB0 through DB7 terminals can be used for controlling data or display data depending on whether the RS terminal is set to a high level or a low level.

The LCD driver chip 100 further comprises a RESETS terminal for inputting a reset signal, CS2 and CS1B terminals for inputting chip select signals, a DISP terminal for inputting/outputting a LCD display blanking control signal, a CL terminal for inputting/outputting a display clock, a M terminal for inputting/outputting a LCD AC signal, and a FRS terminal for outputting a static driver segment for the LCD panel.

The passive element 140 comprises a plurality of passive elements, for example, capacitors and resistors, to be mounted on the COF package 10. In the exemplary embodiment of FIG. 1, the passive element 140 comprises capacitors C1 connected between the V0 through V4 terminals and the ground voltage VSS to stabilize each of the voltages V0 through V4, thereby removing ripple components.

The passive element 150 comprises elements, for example, resistors R1 and R2, and a capacitor C3, for controlling the voltage V0. The passive element 160 comprises a plurality of capacitors C2 for voltage boosting and being connected to the C2− and C2+, C3+ and C3−, and C1+ and C1− terminals, respectively.

In one embodiment of the present invention, the COF package 10 comprises test pads 110 and 120 for testing the electrical function of internally formed terminals of the LCD driver chip. The test pads 110 and 120 test terminals do not lead to the outside of the COF package 10 through the signal-input portion 130.

Figure 2:
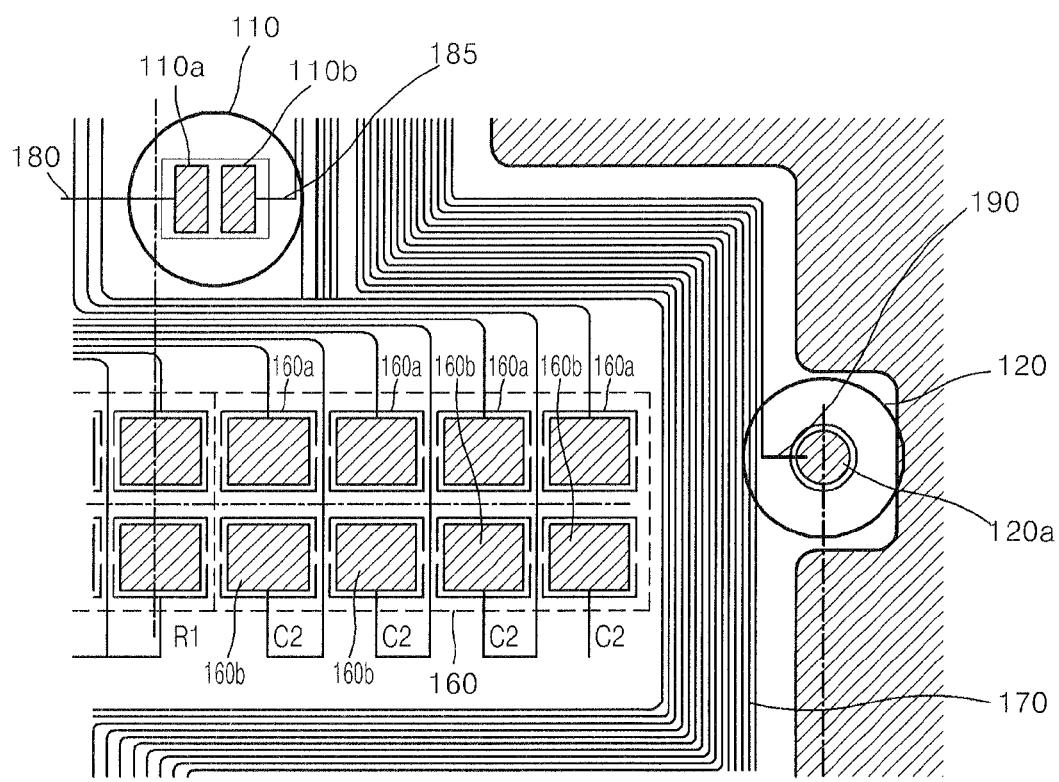
FIG. 2 is a detailed partial diagram of the COF package comprising the test pads of FIG. 1.

FIG. 2 is a detailed partial diagram of the COF package comprising the test pads of FIG. 1. Referring to FIG. 2, the first pad 110 comprises first and second solder patterns 110a and 110b connected to a line 180 for a supply voltage VDD and a CLS signal line 185, respectively. The first and second solder patterns 110 a and 110 b are short-circuited to each other after the testing is completed. The second pad 120 is separately formed from the first pad 110 and is connected to a CL signal line 190, so that a clock signal input/output from the CL terminal can be tested.

Advantageously, the test pads 110 and 120 according to present invention test the electrical functions of terminals of the chip package which do not lead to the outside of the chip package and are integrated into one terminal. For example, the electrical function of the CLS and CL terminals can be tested by the first and second pads 110 and 120 according to the present invention. In contrast, with the conventional COF package, it is not possible to test the electrical function of the CLS terminal because the terminal is always connected to the supply voltage VDD. Further, with the conventional COF package, a test cannot be performed to determine whether the clock signal is normally input or output to the CL terminal, since the input or output to the CL terminal depends on the CLS terminal.

Referring again to FIG. 2, the first pad 110 preferably comprises a first solder pattern 110a and a second solder pattern 110b. The first solder pattern 110a comprises one side connected to the line 180 for receiving a supply voltage VDD, and the second pattern 110b comprises one side connected to the CLS signal line 185. A second pad 120 comprises a third solder pattern 120a connected to a CL signal line 190.

In the COF package 10 according to the invention, each of the passive elements C2 of the passive element 160 is soldered between a first pattern pad 160a and a second pattern pad 160b of the passive element 160. The electrical function tests by the test pads 110 and 120 are performed before soldering each of the passive elements C2 to each pad of the passive element 160. Thus, when the passive element 160 is soldered between the first pattern pad 160a and the second pattern pad 160 b after completing the electrical function test by the test pads 110 and 120, the first and second solder patterns 110a and 110b of the test pad 110 are short-circuited to each other.

Figure 3:
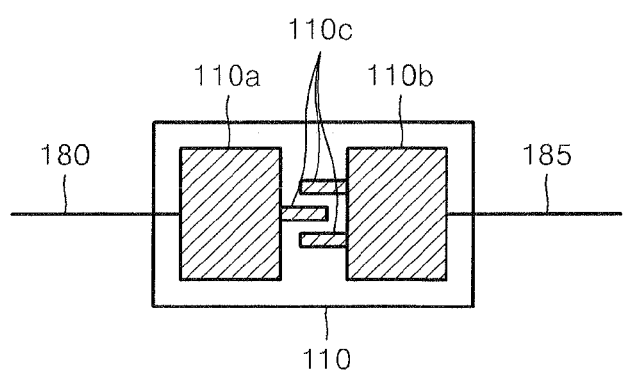
FIG. 3 is a detailed diagram of the first test pad of FIG. 2.

FIG. 3 is a detailed diagram of the first test pad of FIG. 2. Referring to FIG. 3, a test pad 110 comprises first and second solder patterns 110a and 110b and protrusion patterns 110c alternately formed on the center of the solder patterns 110a and 110b such that the first and second solder patterns 110a and 110b are easily short-circuited to each other after completing the electrical function test by the first test pad.

Figure 4:
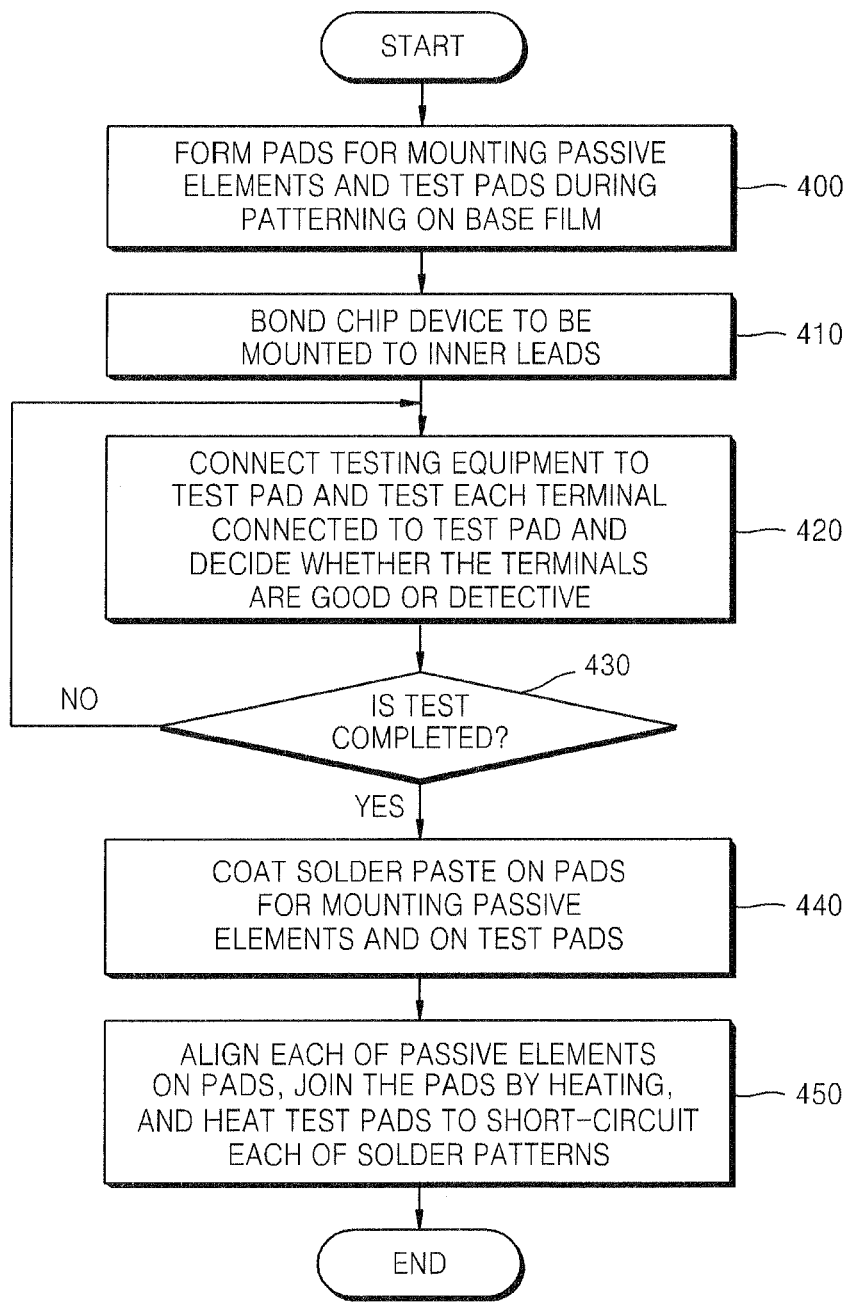
FIG. 4 is a flow chart illustrating a method for manufacturing a COF package according to a preferred embodiment of the present invention.

FIG. 4 is a flow chart illustrating a method for manufacturing a COF package according to one aspect of the present invention. Referring to FIGS. 1 to 4, when a base film is patterned, the pads (for example, 160a, 160b of FIG. 2) for mounting passive elements and a plurality of test pads (for example, 110 and 120) are formed on the base film (step 400). At this time, inner leads for mounting a chip (for example, the LCD driver chip 100 of FIG. 1) are simultaneously formed on the base film. Here, the patterning of the base film preferably comprises adhering a Cu foil on the base film such as a polyimide tape, and wiring the adhered Cu foil according to a designed pattern. Thus, the LCD driver chip 100 to be mounted and the inner leads are bonded to each other, so that the driver chip 100 is mounted on the base film (step 410).

After applying a testing equipment (not shown) to the test pad 110, each terminal connected to the test pad 110 is tested to decide whether or not a terminal is defective (step 420). Once the testing is complete (affirmative result in step 430), a solder paste is coated on the pads 160a and 160b for mounting passive elements and on the test pad 110 (step 440), so that the passive elements such as capacitors and resistors are soldered to the base film by a surface mount device (SMD) method. In one embodiment, a screen-printing method using a metal mask or a solder dotting method may be applied to the pads 160a and 160b on which the passive elements are placed. These methods are well known to a person skilled in the art. Thus, a detailed description thereof will be omitted.

Next, the passive elements are aligned on the pads 160a and 160b and the heating process is performed to join the passive elements and the pads 160a and 160b (step 450). The test pads for which the electrical function test is completed are heated to short-circuit each of the solder patterns. For example, SMD mounting equipment is used for aligning the passive elements on the pads 160a and 160b. The heating process for soldering the passive elements to the pads comprises a reflow method and a laser radiation method. The reflow method joins the pads 160a and 160b to the passive elements by passing the pads through a heated portion. The laser radiation method joins the pads 160a and 160b to passive elements by radiating a laser beam onto a desired portion. Similarly, the test pad 110 may be heated by the reflow method or laser radiation method to short-cut the solder patterns 110a, 110b to each other.

The solder patterns 110a, 110b, and 110c of the test pad 110 can be implemented by various methods. For instance, if there is a chip terminal to be tested, a test pad may be formed on a remaining portion of a base film. After completing the electrical function test of the chip terminal by the test pad, the patterns of the base film are connected to one another. Further, a separate pad such as the test pad 120 of FIG. 1 may be formed on a base film for the terminals requiring an electrical function test.

Advantageously, a COF package according to an embodiment of the present invention comprises a plurality of the passive elements and test pads for testing the electrical function of internally formed chip terminals, which are integrated into one terminal and do not lead to the outside of the COF package, thereby easily performing an electrical function test. Further, a COF package according to a preferred embodiment of the present invention maximizes the advantages of mounting the passive elements with minimizing the limitation of the electrical function test by a conventional COF package.

Figure 5:
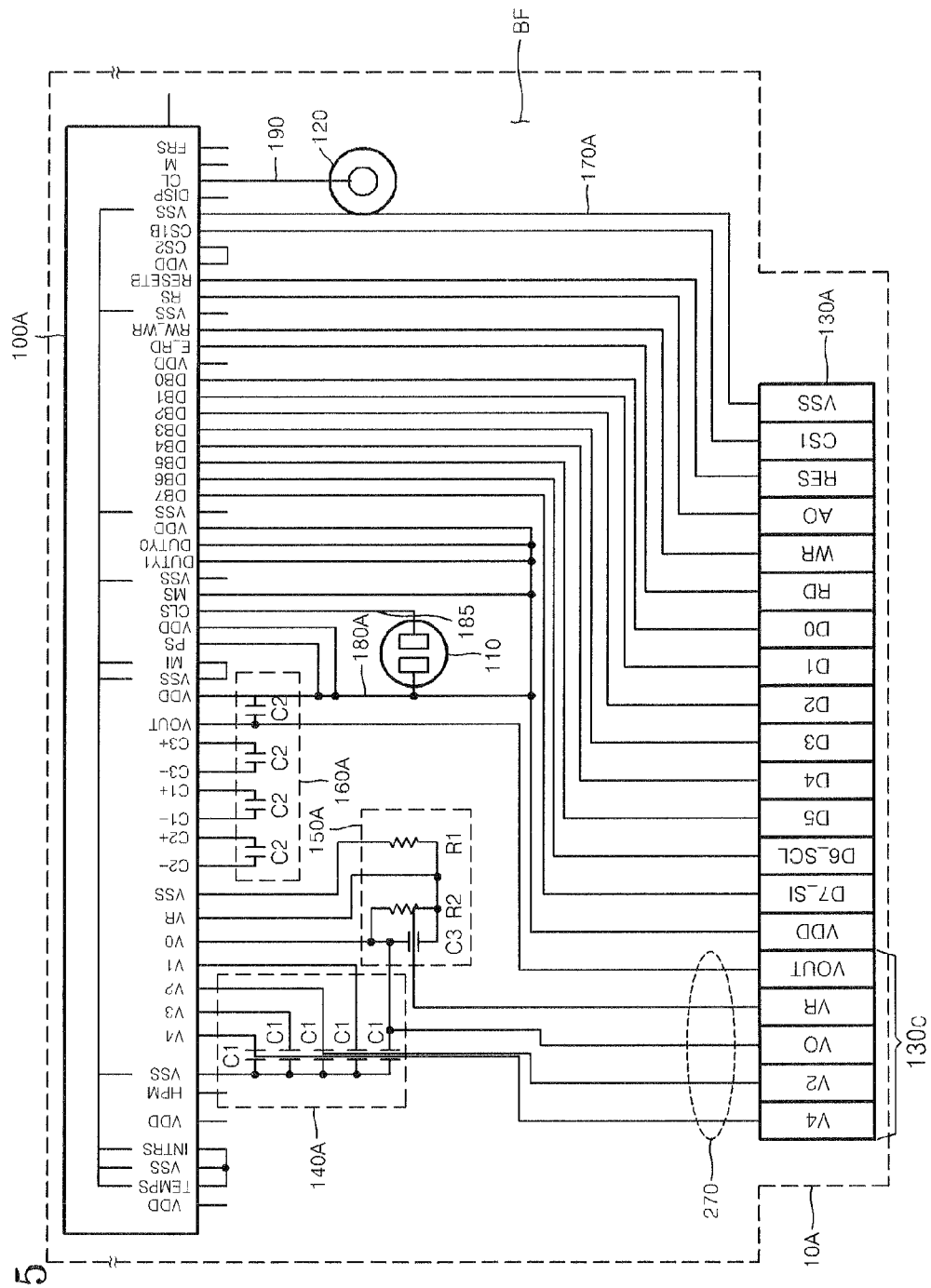
FIG. 5 is a COF package according to another embodiment of the present invention.
Figure 6:
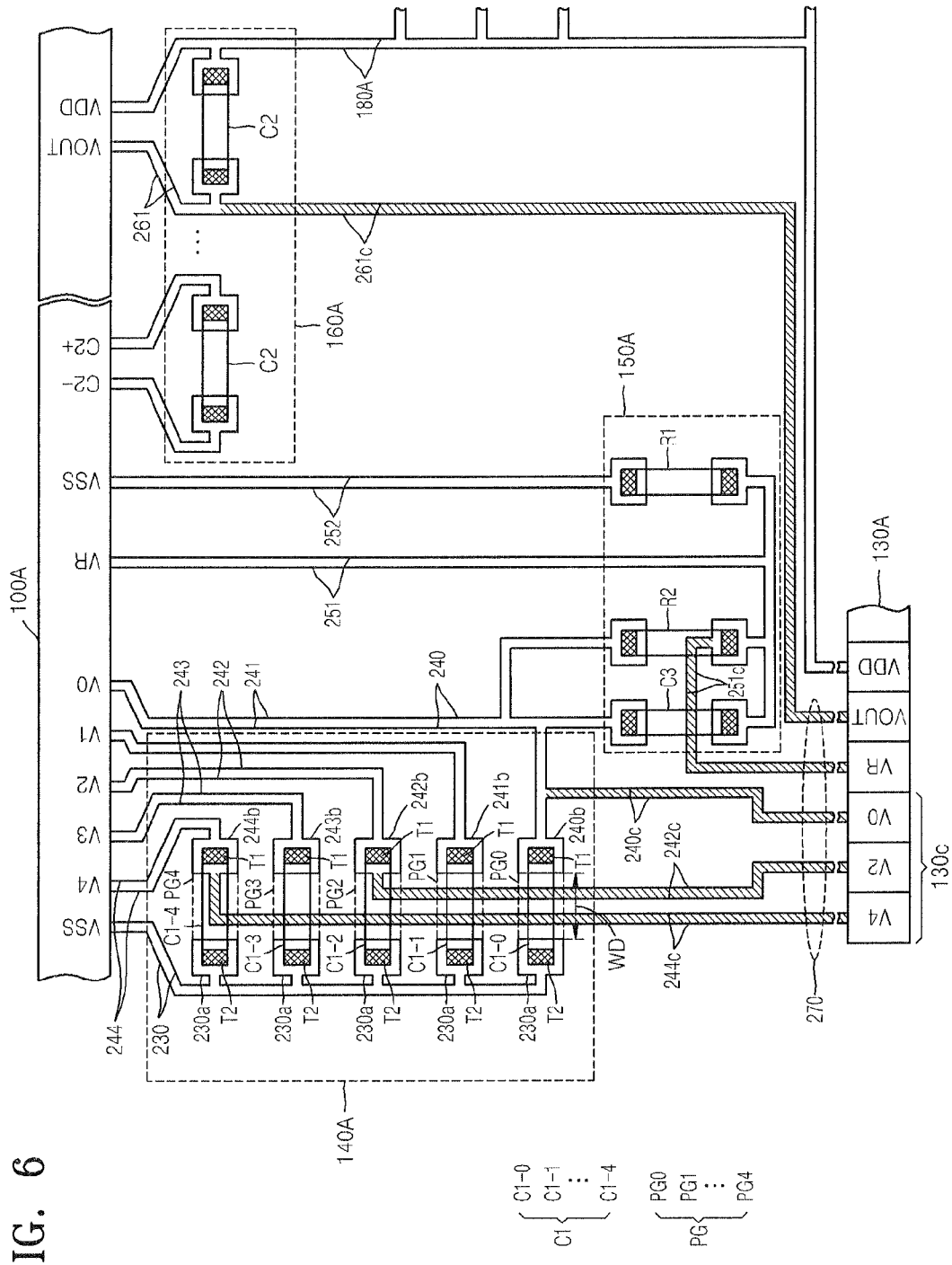
FIG. 6 is a partial enlarged view of FIG. 5.

FIG. 5 is a COF package according to another embodiment of the present invention, and FIG. 6 is a partial enlarged view of FIG. 5. The COF package 10A illustrated in FIG. 5 may include the same elements as those of the COF package 10 of FIG. 1. The same elements as those of FIG. 1 are denoted by like reference numerals and a description thereof will not be provided here.

Referring to FIGS. 5 and 6, the COF package 10A includes a base film (BF), a plurality of signal lines 170A, a semiconductor chip 100A, passive elements 140A, 150A, and 160A, and a signal-inputting portion 130A. The plurality of signal lines 170A are formed on the base film (BF). In addition, the semiconductor chip 100A, the signal-inputting portion 130A, and the passive elements 140A, 150A, and 160A are mounted on the base film (BF). The passive elements 140A, 150A, and 160A include passive elements. The passive elements 140A, 150A, and 160A may be two-terminal elements, such as capacitors C1, C2, and C3, or resistors R1 and R2.

The description of the COF package 10 of FIG. 1 may apply to the COF package 10A illustrated in FIGS. 5 and 6. The description of the LCD driver chip 100, the signal-inputting portion 130, and the passive elements 140, 150, and 160 of FIG. 1 may apply to the plurality of signal lines 170A, the semiconductor chip 100A, the signal-inputting portion 130A, and the passive elements 140A, 150A, and 160A. Thus, the repeated description of the COF package 10 with respect to the COF package 10A of FIGS. 5 and 6 will not be provided here.

The semiconductor chip 100A may be a display device driver chip for driving a display device. For example, the semiconductor chip 100A may be an LCD driver chip. Obviously, the semiconductor chip 100A is not limited to the display device driver chip. The semiconductor chip 100A includes a plurality of terminals VDD, TEMPS, ..., and FRS connected to the plurality of signal lines 170A.

The signal-inputting portion 130A includes a plurality of terminals V4, V2, ..., and VSS connected to the plurality of signal lines 170A. Thus, the plurality of terminals V4, V2, ..., and VSS of the signal-inputting portion 130A are connected to correspondence terminals among the plurality of terminals VDD, TEMPS, ..., and FRS of the semiconductor chip 100A through the plurality of signal lines 170A. The signal-inputting portion 130A may transmit signals applied by an external device, for example, a PCB, to the semiconductor chip 100A through the plurality of signal lines 170A.

In addition, the plurality of terminals V4, V2, . . . , and VSS of the signal-inputting portion 130A may be used as test terminals. The plurality of terminals V4, V2, . . . , and VSS of the signal-inputting portion 130A contact a needle of a probe card and may be used for testing an electrical function of the COF package 10A. In detail, the plurality of terminals VDD, TEMPS, . . . , and FRS of the semiconductor chip 100A connected to the plurality of terminals V4, V2, . . . , and VSS of the signal-inputting portion 130A may be tested. For example, a terminal V4 of the semiconductor chip 100A may be tested by using the terminal V4 of the signal-inputting portion 130A.

Hereinafter, terminals connected to the passive elements 140A, 150A, and 160A among the plurality of terminals V4, V2, . . . , and VSS of the signal-inputting portion 130A are referred to as element terminals 130c including V4, V2, V0, VR, and VOUT. The element terminals 130c including V4, V2, V0, VR, and VOUT of the signal-inputting portion 130A is electrically connected to the correspondence terminals V4, V2, V0, VR, and VOUT of the semiconductor chip 100A. In addition, the terminals V4, V2, V0, VR, and VOUT of the semiconductor chip 100A corresponding to the element terminals 130c including V4, V2, V0, VR, and VOUT are connected to the passive elements 140A, 150A, and 160A.

The description of the signal-inputting portion 130 of FIG. 1 may apply to the signal-inputting portion 130A of FIGS. 5 and 6 except that the signal-inputting portion 130A of FIGS. 5 and 6 includes the element terminals 130c. Thus, a repeated description thereof will not be provided here.

Hereinafter, signal lines connected to the passive elements 140A, 150A, and 160A among the plurality of signal lines 170A will be described in detail.

The plurality of signal lines 170A include signal lines 230, 240 to 244, 251, 252, and 261 for connecting the passive elements 140A, 150A, and 160A to the semiconductor chip 100A.

The passive element 140A includes a plurality of capacitors C1-0 to C1-4 that can be referred to as C1. Each of the plurality of capacitors C1-0 to C1-4 (C1) includes a plurality of terminals T1 and T2. For example, a first terminal T1 of a second capacitor C1-2 is connected to a terminal V2 of the semiconductor chip 100A through a V2 signal line 242.

V0 to V4 signal lines 240 to 244 include connection pads 240b to 244b for connecting the V0 to V4 signal lines 240 to 244 to the first terminal T1 of each of the plurality of capacitors C1-0 to C1-4 (C1). For example, the V4 signal line 244 includes the connection pad 244b for connecting the V4 signal line 244 to the first terminal T1 of a fourth capacitor C1-4.

A VSS signal line 230 includes connection pads 230a for connecting the VSS signal line 230 to the second terminal T2 of each of the plurality of capacitors C1-0 to C1-4 (C1). The connection pads 240b to 244b and the connection pads 230a for the capacitors C1-0 to C1-4 (C1) may be spaced apart from one another by pad gaps (PG) PG1 to PG4. Hereinafter, a distance at which the connection pads 240b to 244b and the connection pads 230a for the capacitors C1-0 to C1-4 (C1) are spaced apart from one another, is referred to as a width (WD) of the pad gaps PG1 to PG4.

The V0, V2, and V4 signal lines 240, 242, and 244 include test lines 240c, 242c, and 244c respectively connected to the signal-inputting portion 130A, respectively. For example, the V2 signal line 242 includes the test line 242c connected to the terminal V2 of the signal-inputting portion 130A. In detail, the first terminal T1 of the second capacitor C1-2 is connected to the terminal V2 of the semiconductor chip 100A and the terminal V2 of the signal-inputting portion 130A through the V2 signal line 242 including the test line 242c.

The test lines 242c and 244c of the V2 and V4 signal lines 242 and 244 may pass through the pad gaps (PG). The test line 244c connected to the fourth capacitor C1-4 may protrude from the connection pad 244b towards the fourth pad gap PG4 for the fourth capacitor C1-4. In addition, the test line 244c may pass through zeroth through third pad gaps PG0 to PG3 for zeroth through third capacitors C1-0 to C1-3 that are adjacent to the fourth capacitor C1-4. The test line 242c connected to the second capacitor C1-2 may protrude from the connection pad 242b towards the second pad gap PG2 and thus may pass through the zeroth and first pad gaps PG0 and PG1 that are adjacent to the second pad gap PG2.

If the test line 244c connected to the fourth capacitor C1-4 passes through the second pad gap PG2, the test line 244c connected to the fourth capacitor C1-4 is disposed under the second capacitor C1-2. In this case, the other portions than the first and second terminals T1 and T2 of the second capacitor C1-2 are insulated. Thus, the second capacitor C1-2 is not electrically connected to the test line 244c connected to the fourth capacitor C1-4.

In FIGS. 5 and 6, the V0, V2, and V4 signal lines 240, 242, and 244 among the signal lines 230 and 240 to 244 connected to the passive element 140A include the test lines 240c, 242c, and 244c. However, the present invention is not limited thereto. Although not shown in FIGS. 5 and 6, the V1 and V3 signal lines 241 and 243 may also include test lines. The test lines of the V1 and V3 signal lines 241 and 243 may also pass through the pad gaps PG. In this case, the number of test lines that may pass through one pad gap may be limited by the width (WD) of the pad gap. Thus, only test lines for some terminals, such as V0, V2, and V4, among the terminals V0 to V4 for the passive element 140A may be formed.

In FIGS. 5 and 6, the test line 240c of the V0 signal line 240 does not pass through the pad gaps (PG). In this case, unlike in FIG. 5, the test line 240c of the V0 signal line 240 may also be formed to pass through the pad gaps (PG).

Ends of the passive elements C3, R1, and R2 included in the passive element 150A are connected to the terminal VR of the semiconductor chip 100A through a VR signal line 251. The VR signal line 251 may include a test line 251c connected to the terminal VR of the signal-inputting portion 130A.

The passive element 160A is connected to the terminal VOUT of the semiconductor chip 100A through a VOUT signal line 261. The VOUT signal line 261 may include a test line 261c connected to the terminal VOUT of the signal-inputting portion 130A.

The description of the test lines 240c, 242c, and 244c for the passive element 140A may apply to the test lines 251c and 261c for the passive elements 150A and 160A. Thus, a repeated description thereof will not be provided here.

In FIGS. 5 and 6, the VOUT signal line 261 connected to the terminal VOUT among the terminals V4, V2, V0, VR, and VOUT of the semiconductor chip 100A connected to the passive element 160A include the test line 261c. However, the present invention is not limited thereto. Although not shown in FIGS. 5 and 6, test lines for other terminals C2−, C2+, C1−, C1+, C3−, and C3+ to be connected to the passive element 160A may also be formed.

The most part of the terminals (e.g., V4, V2, V0, VR, and VOUT) of the semiconductor chip 100 connected to the passive elements 140, 150, and 160 of FIG. 1 does not lead to the outside of the COF package 10. In other words, in the COF package 10 of FIG. 1, electrical function testing of the terminals, for example, terminals V0 to V4, of the semiconductor chip 100 that are connected to the passive elements 140, 150, and 160 and do not lead to the outside of the COF package 10 is limited.

In the COF package 10A of FIGS. 5 and 6, test lines 270 including 244c, 242c, 240c, 251c, and 261c for the passive elements 140A, 150A, and 160A are formed on the base film (BF). Thus, the terminals V4, V2, V0, VR, and VOUT of the semiconductor chip 100A connected to the passive elements 140A, 150A, and 160A may be tested by using the element terminals 130c of the signal-inputting portion 130A. In this case, the terminals V4, V2, V0, VR, and VOUT of the semiconductor chip 100A may be tested after the passive elements 140A, 150A, and 160A are mounted on the base film (BF).

In addition, signals applied by an external device may be also transmitted to the terminals V4, V2, V0, VR, and VOUT of the semiconductor chip 100A through the element terminals 130c of the signal-inputting portion 130A.

To sum up, a third terminal (e.g., V2) of the semiconductor chip 100A connected to a first passive element (e.g., C1-2) that is one of a plurality of passive elements C1, C2, C3, R1, and R2 mounted on the base film (BF) may be connected to the element terminals 130c of the signal-inputting portion 130A through a first test line (e.g., 242c). The first test line is included in a first signal line (e.g., 242) for connecting a first terminal (e.g., T1) that is one of a plurality of terminals of the first passive element to the third terminal of the semiconductor chip 100A. The first test line may protrude towards a pad gap (PG) (e.g., PG2) for the first passive element. In addition, the first test line may pass through a pad gap (PG) (e.g., PG1) for a second passive element (e.g., C1-1) that is adjacent to the first passive element.

Thus, the third terminal of the semiconductor chip 100A connected to the first passive element and the first test line may be tested by using the element terminals 130c of the signal-inputting portion 130A.

In addition, signals applied by an external device may be transmitted to the third terminal of the semiconductor chip 100A connected to the first passive element and the first test line through the element terminals 130c of the signal-inputting portion 130A.

Figure 7:
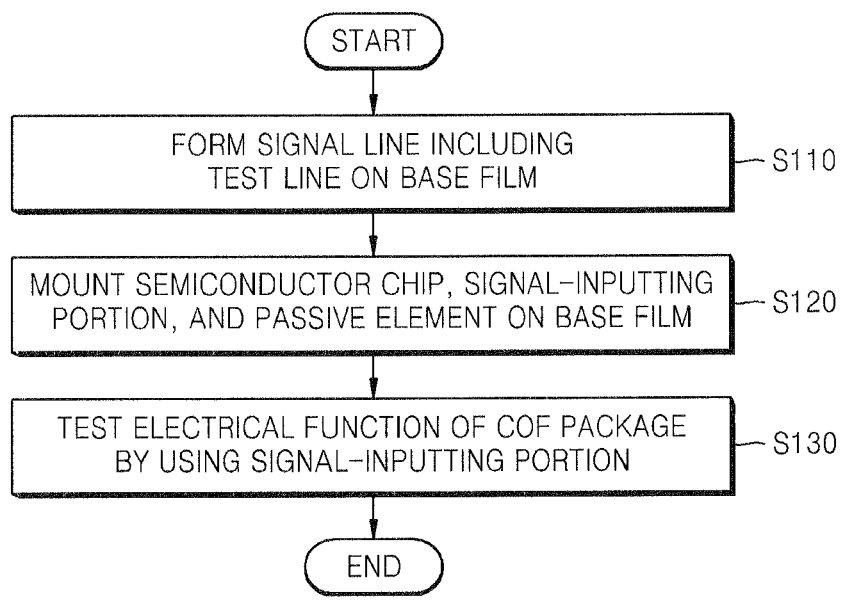
FIG. 7 is a flowchart illustrating a method for manufacturing the COF package of FIG. 5, according to another embodiment of the present invention.

FIG. 7 is a flowchart illustrating a method for manufacturing the COF package of FIG. 5, according to another embodiment of the present invention.

Referring to FIGS. 5 through 7, a plurality of signal lines 170A in the form of a printed circuit pattern are formed on a base film (BF) in operation S110. The plurality of signal lines 170A include test lines 270 including 244c, 242c, 240c, 251c, and 261c.

A semiconductor chip 100A, a signal-inputting portion 130A, and passive elements 140A, 150A, and 160A are mounted on the base film (BF) in operation S120. The semiconductor chip 100A, the signal-inputting portion 130A, and the passive elements 140A, 150A, and 160A may be mounted by using a surface mount technology (SMT). The order of mounting the semiconductor chip 100A, the signal-inputting portion 130A, and the passive elements 140A, 150A, and 160A is not specifically limited.

An electrical function of the COF package 10A is tested by using the signal-inputting portion 130A in operation 5130. Terminals V4, V2, V0, VR, and VOUT of the semiconductor chip 100A connected to the test lines 270 and the passive elements 140A, 150A, and 160A may be tested by using element terminals 130c of the signal-inputting portion 130A.

After testing of the electrical function of the COF package 10A has been completed, the COF package 10A may be connected to a PCB via the signal-inputting portion 130A. Signals applied by an external device, for example, a PCB, may be transmitted to the terminals V4, V2, V0, VR, and VOUT of the semiconductor chip 100A connected to the test lines 270 and the passive elements 140A, 150A, and 160A through the element terminals 130c of the signal-inputting portion 130A.

The terminals V4, V2, V0, VR, and VOUT of the semiconductor chip 100A may be tested after the passive elements 140A, 150A, and 160A are mounted on the base film (BF). The test pads 110 and 120 of the COF package 10 of FIG. 1 are to be tested before the passive elements 140, 150, and 160 are mounted on the base film (BF) (see FIGS. 1 through 4). On the other hand, in the COF package 10A of FIG. 5, testing of the terminals V4, V2, V0, VR, and VOUT of the semiconductor chip 100A connected to the test lines 270 is not required to be performed before the passive elements 140A, 150A, and 160A are mounted on the base film (BF). In detail, the test lines 270 are formed on the COF package 10A so that a degree of freedom in the order of testing is increased.

In addition, the test lines 270 are formed using pad gaps (PG) for the passive elements 140A, 150A, and 160A so that a degree of space utilization is increased. In addition, the COF package 10A may be implemented as one layer so that a process of manufacturing the COF package 10A is simplified and manufacturing cost is reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A chip on film (COF) package comprising:
   a base film;
   a semiconductor chip mounted on the base film;
   a signal-inputting portion mounted on the base film;
   a first passive element mounted on the base film and comprising first and second terminals; and
   a first signal line formed on the base film and connecting the first passive element to the semiconductor chip,
   wherein the first signal line comprises a connection pad connected to the first terminal of the first passive element and a first test line connected to the signal-inputting portion and the first terminal, wherein the first test line protrudes from the connection pad towards a first pad gap positioned between the first terminal and the second terminal of the first passive element, and the first test line passes through the first pad gap.

2. The COF package of claim 1, wherein the first test line passes through a second pad gap for a second passive element that is adjacent to the first passive element.

3. The COF package of claim 1, wherein a third terminal that is one among a plurality of terminals of the semiconductor chip is electrically connected to the first passive element and an element terminal that is one of a plurality of terminals of the signal-inputting portion through the first signal line comprising the first test line.

4. The COF package of claim 3, wherein the third terminal of the semiconductor chip is tested by using the element terminal of the signal-inputting portion.

5. The COF package of claim 4, wherein the third terminal of the semiconductor chip is tested after the first passive element is mounted on the base film.

6. The COF package of claim 5, wherein the first passive element comprises a capacitor or a resistor.

7. The COF package of claim 6, wherein the semiconductor chip comprises a display device driver chip for driving a display device.

8. The COF package of claim 7, wherein an external signal applied to the element terminal of the signal-inputting portion is transmitted to the third terminal of the semiconductor chip through the first test line.

\* \* \* \* \*